United States Patent
Gantioler et al.

[11] Patent Number: 5,828,263
[45] Date of Patent: Oct. 27, 1998

[54] FIELD EFFECT-CONTROLLABLE POWER SEMICONDUCTOR COMPONENT WITH TEMPERATURE SENSOR

[75] Inventors: Josef-Matthias Gantioler; Holger Heil; Norbert Krischke, all of München, Germany

[73] Assignee: Siemens Aktiengesellschaft, Munich, Germany

[21] Appl. No.: 770,874

[22] Filed: Dec. 20, 1996

[30] Foreign Application Priority Data

Dec. 21, 1995 [DE] Germany ............... 195 48 060.0

[51] Int. Cl.⁶ ................................. H01L 35/00
[52] U.S. Cl. ................ 327/512; 257/341; 257/370; 257/378; 257/467
[58] Field of Search .................... 327/512, 513, 327/566, 565; 257/328, 341, 362, 370, 378, 467

[56] References Cited

U.S. PATENT DOCUMENTS

| | | | |
|---|---|---|---|
| 4,622,476 | 11/1986 | Venkatesh | 327/513 |
| 4,875,131 | 10/1989 | Leipold et al. | 361/103 |
| 5,041,895 | 8/1991 | Contiero et al. | 257/328 |
| 5,237,481 | 8/1993 | Soo et al. | 361/103 |
| 5,457,419 | 10/1995 | Tihanyi | 327/513 |
| 5,677,558 | 10/1997 | McGlinchey | 257/370 |

FOREIGN PATENT DOCUMENTS

| | | |
|---|---|---|
| 0 409 214 A2 | 1/1991 | European Pat. Off. . |
| 0561461A2 | 9/1993 | European Pat. Off. . |

*Primary Examiner*—Timothy P. Callahan
*Assistant Examiner*—Jung Ho Kim
*Attorney, Agent, or Firm*—Herbert L. Lerner; Laurence A. Greenberg

[57] ABSTRACT

A temperature sensor contains a bipolar transistor adjacent a cell array of a power MOSFET or IGBT. In order to detect temperature independently of a voltage drop across the power semiconductor component, a zone of the same conduction type is disposed between the cell array and a base zone. That zone is connected to a fixed bias voltage.

9 Claims, 1 Drawing Sheet

FIELD EFFECT-CONTROLLABLE POWER SEMICONDUCTOR COMPONENT WITH TEMPERATURE SENSOR

BACKGROUND OF THE INVENTION:

Field Of The Invention:

The invention relates to a field effect-controllable power semiconductor component, including a multiplicity of cells connected in parallel with one another, and a temperature sensor containing a bipolar transistor and being disposed adjacent the cell array of the power semiconductor component, wherein a base zone of the bipolar transistor and gate zones of the power semiconductor component are of the same conduction type, and a collector zone of the bipolar transistor and a drain zone of the power semiconductor component are formed by a single zone of a semiconductor body of the power semiconductor component.

Power semiconductor components of the aforementioned type are commercially available, for example in the form of so-called SMART-FETs. The principle of a temperature sensor of the aforementioned type has been described, for example, in Published European Patent Application 0 240 807 A1. The temperature sensor therein contains a reverse-biased bipolar transistor, with which a depletion-mode FET connected as a constant current source is connected in series. That temperature sensor is thermally coupled to the power semiconductor component by being disposed adjacent, for example, in a recess in the cell array.

The current of the constant-current source is then set in such a way that it is higher than that reverse current of the bipolar transistor which flows at the normal operating temperature of the power semiconductor component. However, it is lower than that reverse current which flows in the event of an overtemperature of the power semiconductor component. During the transition from normal operating temperature to overtemperature, a pronounced voltage rise then occurs across the depletion-mode MOSFET, which pronounced voltage rise signals the overtemperature.

The temperature sensor can be mounted as a chip on the semiconductor body of the power semiconductor component or it can be monolithically integrated in the same semiconductor body. In the monolithically integrated solution, the base zone of the bipolar transistor and the gate zones of the power semiconductor component are of the same conduction type. The collector zone of the bipolar transistor and the drain zone of the power semiconductor component are formed by a single zone of the semiconductor body of the power semiconductor component.

As mentioned, the current of the reverse-biased bipolar transistor becomes larger as a result of the increase in the temperature of the power semiconductor component. That current is composed of the actual reverse current of the bipolar transistor and a diffusion current, which is produced by a concentration difference of the minority charge carriers between the boundary of the space charge zone of the power semiconductor component on one hand, and the boundary of the space charge zone of the bipolar transistor on the other hand. That diffusion current is thus not only temperature dependent, but also depends on the potential of the source terminal of the power semiconductor component. In the case of power semiconductor components having a load on the source side, the magnitude of the diffusion current is therefore also influenced by whether the load is in the normal state or is completely or partially short-circuited. As a result, the transistor current becomes not only temperature-dependent, but also load-dependent. Satisfactory detection of the overtemperature is thus not possible.

SUMMARY OF THE INVENTION:

It is accordingly an object of the invention to provide a field effect-controllable power semiconductor component with a temperature sensor, which overcomes the hereinafore-mentioned disadvantages of the heretofore-known devices of this general type in such a way that a temperature detection is independent of a source potential of the power semiconductor component.

With the foregoing and other objects in view there is provided, in accordance with the invention, a field effect-controllable power semiconductor component assembly, comprising a power semiconductor component including a semiconductor body, and a cell array with a multiplicity of cells connected in parallel with one another and having gate zones and a drain zone; and a temperature sensor adjacent the cell array of the power semiconductor component, the temperature sensor including a bipolar transistor with a base zone and a collector zone; the base zone of the bipolar transistor and the gate zones of the power semiconductor component being of the same conduction type; the semiconductor body of the power semiconductor component having a single zone forming the collector zone of the bipolar transistor and the drain zone of the power semiconductor component; and at least one zone of the same conduction type disposed between the base zone of the bipolar transistor and the gate zones of the cells of the power semiconductor component, the at least one zone connected to a fixed bias voltage at most equal to a supply voltage applied to the power semiconductor component.

In accordance with another feature of the invention, the fixed bias voltage can be changed over between two different voltage values.

In accordance with a further feature of the invention, the at least one zone has at least the same doping as the gate zones.

In accordance with an added feature of the invention, the at least one zone has at least the same depth as the gate zones.

In accordance with an additional feature of the invention, there is provided a surface of the semiconductor body, an electrode insulated from and covering the surface of the semiconductor body between the base zone of the bipolar transistor and the at least one zone, the electrode electrically connected to the at least one zone or to the base zone of the bipolar transistor.

In accordance with yet another feature of the invention, the electrode is formed of doped polysilicon.

In accordance with a concomitant feature of the invention, there is provided a current-dependent resistor connected between the base terminal and the emitter terminal of the bipolar transistor, the resistor having a first resistance below a predetermined current and a second higher resistance when the predetermined current is exceeded.

Other features which are considered as characteristic for the invention are set forth in the appended claims.

Although the invention is illustrated and described herein as embodied in a field effect-controllable power semiconductor component with a temperature sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the follow-

3 ing description of specific embodiments when read in connection with the accompanying drawings.

Figure 1:
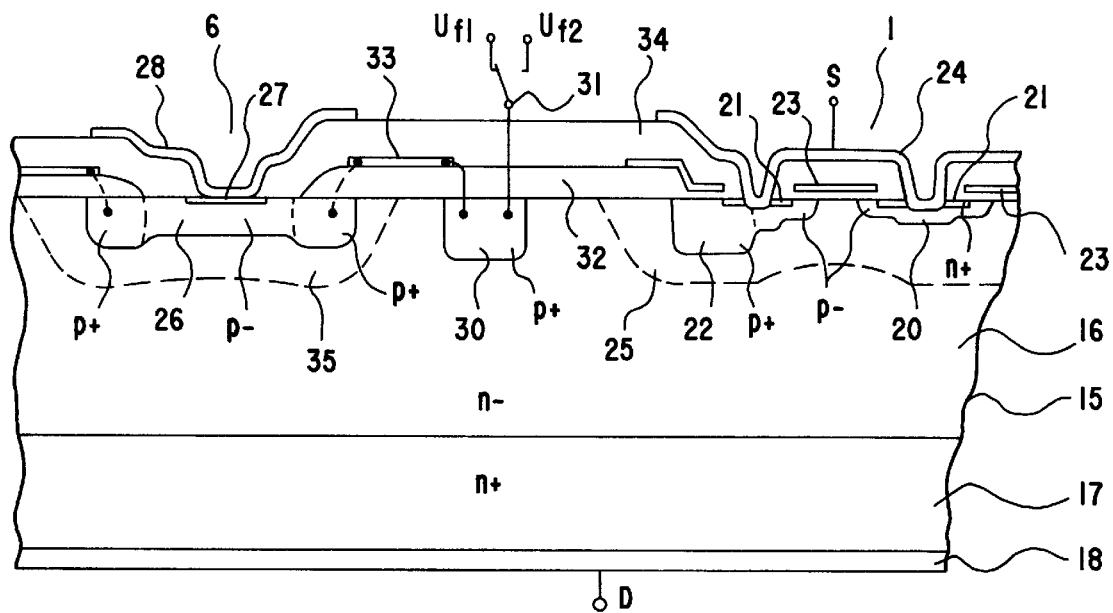
FIG. 1 is a fragmentary, diagrammatic, sectional view through a power semiconductor component according to the invention.

DESCRIPTION OF THE PREFERRED EMBODIMENTS:

Referring now to the figures of the drawings in detail and first, particularly, to FIG. 1 thereof, there is seen a power semiconductor component 1 which has a semiconductor body 15 with a weakly n-doped drain zone 16. The zone 16 is adjoined by a heavily n-doped zone 17 having one surface with which contact is made through the use of a drain electrode 18. A p-doped gate zone 20 is embedded in another surface of the semiconductor body. A heavily n-doped source zone 21 in turn is embedded in the gate zone 20. The gate zone is covered by a gate electrode 23, which is disposed on an insulating layer. Contact is made with the gate zone 20 and the source zone 21 through the use of a source electrode 24 which is connected to a source terminal S.

The gate zone 20 and the source zone 21 form a cell of the power semiconductor component. A multiplicity of cells are disposed on the semiconductor body. All of the cells are connected in parallel with one another through the use of the source electrode 24. The gate electrode 23 is likewise shared by all of the cells. The zone 16 of the semiconductor body 15 forms the drain zone of all of the cells.

A marginal cell, which includes a gate zone 22 and a source zone 21, is disposed adjacent the illustrated cell. Contact is made with these zones too, through the use of the source electrode 24. The gate zone 22 is formed with a greater depth than the gate zone 20 and this feature, in conjunction with the illustrated field electrode, establishes a favorable course of the space charge zone at the surface of the semiconductor body in a known manner. The zones form a power MOSFET.

A p-doped base zone 26 is additionally embedded in the source-side surface of the semiconductor body 15 and an n-doped emitter zone 27 is in turn embedded in the base zone 26. Contact is made with the emitter zone through the use of an emitter electrode 28. These zones, together with the zone 16 acting as a collector zone, form a bipolar transistor which is designated by reference numeral 6.

A p-doped zone 30 is embedded in the source-side and emitter-side surface of the semiconductor body 15, between the power semiconductor component 1 and the bipolar transistor 6. Contact is made with this zone and it is connected to a terminal 31, to which one fixed bias voltage or alternatively different fixed bias voltages, can be applied. A distance between the zone 30 and the bipolar transistor 6 on one hand, and between the zone 30 and the power semiconductor component 1 on the other hand, is selected in such a way that respective space charge zones 35 and 25, which are delimited by dashed lines, do not abut the zone 30. The zone 30 expediently has the same depth and doping as the deep part of the gate zone 22.

In order to explain the method of operation of the configuration, it is first of all assumed that the p-doped zone 30 is not present. With the power semiconductor component 1 switched on and given a normal state of a load 2 shown in FIG. 2, a potential $V_{bb}$ is present at a source terminal of the power semiconductor component 1. A pn junction between the zones 16 and 22 is thus not blocked and a minority carrier charge density is thus in thermal equilibrium ($P_{no}$) at its edge and is only dependent on temperature. A pn junction of the bipolar transistor between the zones 26 and 16 is reverse-biased, and a minority carrier charge density is therefore reduced in this case. Due to the concentration gradient, a diffusion current flows from an edge of the space charge zone 35 into the bipolar transistor 6.

If the source potential of the power semiconductor component 1 is reduced, for example as a result of a short circuit of the load 2, then the pn junction between the zones 22 and 16 becomes reverse-biased and the minority carrier charge density at an edge of the space charge zone 25 is reduced. If the distance between the p-type zones 22 and 26 is on the order of magnitude of the diffusion length, then the minority carrier charge density is reduced in the entire region between the zones 22 and 26. As a result, the diffusion current into the bipolar transistor 6 drops as a function of the source potential at the power semiconductor component 1 and an overtemperature could not be unambiguously detected.

An effective remedy can be achieved by the zone 30, which is connected to a fixed bias voltage. If the zone 30 is connected, for example, to the potential $V_{bb}$, a density of minority charge carriers which corresponds to the thermal equilibrium is established at its pn junction. The density is reduced at the edge of the biased pn junction between the zones 26 and 16, and therefore a diffusion current flows, as described above, into the bipolar transistor 6. Since the density of the minority charge carriers in the vicinity of the zone 30 is in thermal equilibrium both between the zone 30 and the space charge zone 25 as well as between the zone 30 and the space charge zone 35, the diffusion current into the bipolar transistor 6 is independent of the source potential at the power semiconductor component 1.

The effect of the zone 30 can additionally be improved by covering the surface of the semiconductor body between the zone 30 and the base zone 26 with a field electrode 33, which for its part is disposed on an insulating layer 32. The field electrode 33 for its part can be covered by an insulating layer 34, on which the emitter electrode 28 and the source electrode 24 lie. The field electrode 33 can be electrically connected either to the zone 30 or to the base zone 26. It is thus possible to adjust the potentials at the surface of the semiconductor body. Depending on whether the field electrode 33 is connected to the zone 30 or to the base zone 26, the zone sequence 26, 16, 30 acts as an MOS diode or as a transistor in the off state.

The zone 30, instead of just being connected to a single fixed bias voltage, can alternatively also be connected to a plurality, in this case to two, of fixed bias voltages $Uf_1$, $Uf_2$ of different magnitude. The magnitude of the diffusion current is thus adjustable. It holds true in this case that the response threshold of the temperature sensor at a lower bias voltage is shifted towards higher temperatures, whereas at a higher bias voltage it is shifted towards lower temperatures. Accordingly, it is possible to adjust a switching hysteresis of the temperature sensor by changing over the bias voltages.

Figure 2:
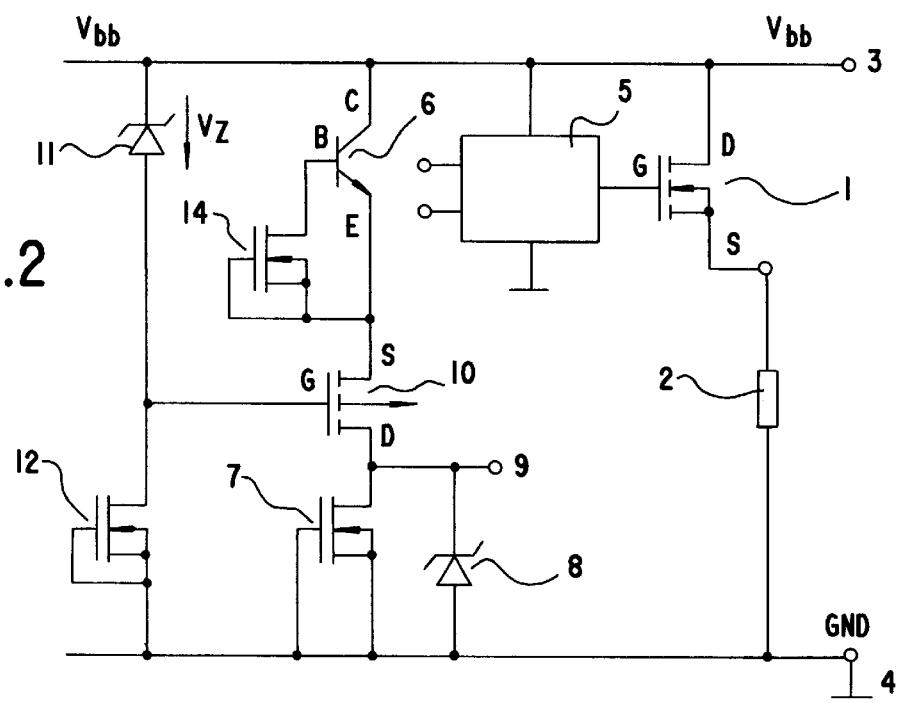
FIG. 2 is a schematic diagram of a circuit configuration of a known temperature sensor for detecting overtemperature of a power semiconductor component, wherein the invention can be employed in the circuit configuration.

The circuit configuration according to FIG. 2 contains the power semiconductor component 1 and the temperature sensor having the bipolar transistor 6. A p-channel MOSFET 10 and a current source 7 are connected in series with the bipolar transistor 6 on the emitter side. The current source 7 advantageously is formed of a first depletion-mode FET, having a gate terminal and a source terminal which are connected together. A Zener diode 8 is connected in parallel with the current source 7. A node between the MOSFETs 7 and 10 is connected to an output 9. A series circuit formed by a Zener diode 11 and a second depletion-mode FET 12 connected as a current source, is connected in parallel with a series circuit formed by the elements 6, 10 and 7. A node between the Zener diode 11 and the FET 12 is connected to a gate terminal G of the MOSFET 10. A current source 14 can be connected between the base terminal and the emitter terminal of the bipolar transistor 6. The current source 14 is dimensioned in such a way that it forms a short circuit in the event of a base current flowing at normal temperature, but acquires a high impedance above that temperature. As a result, the temperature sensor becomes insensitive to disturbances that are caused, for example, by voltage fluctuations.

The power semiconductor component 1 is a power MOSFET. The load 2 is connected to ground 4 and in series with the power MOSFET 1 on the source side. The power semiconductor component 1 is controlled by a drive circuit 5, the output of which is connected to the gate terminal of the power semiconductor component 1.

The circuit, which is described in principle in U.S. Pat. No. 4, 875,131, for example, has the following method of operation: the gate terminal of the MOSFET 10 is connected through the diode 11 and the MOSFET 12 to a constant potential $'bb-^U z$. A constant voltage $U_z - V_{th10}$ is then applied to the bipolar transistor 6. The depletion-mode FET 7 is dimensioned in such a way that its saturation current at the normal operating temperature of the semiconductor component 1 is greater than the reverse current of the bipolar transistor 6.

The potential at the output 9 is then approximately at earth potential. As the temperature of the power semiconductor component rises, the reverse current of the bipolar transistor 6 rises exponentially with the temperature. When the overtemperature is reached, the reverse current of the bipolar transistor 6 exceeds the saturation current of the MOSFET 7. As a result, a voltage rise occurs at the output 9, and the voltage rise indicates overtemperature. The voltage is limited by the Zener diode 8.

The invention can be used in any monolithically integrated circuits, independently of the circuit configuration illustrated in FIG. 2.

The invention can also be used for IGBTs. In that case, the heavily n-doped zone 17 in the region of the MOSFET 1 is replaced by a heavily p-doped zone.

we claim:

1. A field effect-controllable power semiconductor component assembly, comprising:

a power semiconductor component including a semiconductor body, and a cell array with a multiplicity of cells connected in parallel with one another and having gate zones and a drain zone; and a temperature sensor adjacent said cell array of said power semiconductor component, said temperature sensor including a bipolar transistor with a base zone and a collector zone;

said base zone of said bipolar transistor and said gate zones of said power semiconductor component being of the same conduction type;

said semiconductor body of said power semiconductor component having a single zone forming said collector zone of said bipolar transistor and said drain zone of said power semiconductor component; and at least one zone of the same conduction type disposed between said base zone of said bipolar transistor and said gate zones of said cells of said power semiconductor component, said at least one zone connected to a fixed bias voltage at most equal to a supply voltage applied to said power semiconductor component.

2. The power semiconductor component according to claim 1, wherein the fixed bias voltage can be changed over between two different voltage values.

3. The power semiconductor component according to claim 1, wherein said at least one zone has at least the same doping as said gate zones.

4. The power semiconductor component according to claim 1, wherein said at least one zone has at least the same depth as said gate zones.

5. The power semiconductor component according to claim 1, including a surface of said semiconductor body, an electrode insulated from and covering said surface of said semiconductor body between said base zone of said bipolar transistor and said at least one zone, said electrode electrically connected to said at least one zone.

6. The power semiconductor component according to claim 1, including a surface of said semiconductor body, an electrode insulated from and covering said surface of said semiconductor body between said base zone of said bipolar transistor and said at least one zone, said electrode electrically connected to said base zone of said bipolar transistor.

7. The power semiconductor component according claim 5, wherein said electrode is formed of doped polysilicon.

8. The power semiconductor component according claim 6, wherein said electrode is formed of doped polysilicon.

9. The power semiconductor component according to claim 1, including a current-dependent resistor connected between the base terminal and the emitter terminal of said bipolar transistor, said resistor having a first resistance below a predetermined current and a second higher resistance when the predetermined current is exceeded.

* * * * *